United States Patent
Li

(10) Patent No.: US 10,270,988 B2
(45) Date of Patent: Apr. 23, 2019

(54) METHOD FOR GENERATING HIGH-DYNAMIC RANGE IMAGE, CAMERA DEVICE, TERMINAL AND IMAGING METHOD

(71) Applicant: GUANGDONG OPPO MOBILE TELECOMMUNICATIONS CORP., LTD., Dongguan (CN)

(72) Inventor: Xiaopeng Li, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/591,693

(22) Filed: May 10, 2017

(65) Prior Publication Data

US 2017/0244916 A1 Aug. 24, 2017

Related U.S. Application Data

(63) Continuation of application No. PCT/CN2016/100883, filed on Sep. 29, 2016.

(30) Foreign Application Priority Data

Dec. 18, 2015 (CN) .......................... 2015 1 0963939

(51) Int. Cl.
*H04N 5/353* (2011.01)
*H04N 5/347* (2011.01)
(Continued)

(52) U.S. Cl.
CPC ..... *H04N 5/3535* (2013.01); *H01L 27/14621* (2013.01); *H01L 27/14627* (2013.01);
(Continued)

(58) Field of Classification Search
CPC ...... H04N 9/045; H04N 5/232; H04N 5/3355; H04N 5/347; H04N 2209/043
(Continued)

(56) References Cited

U.S. PATENT DOCUMENTS

| 6,999,119 B1 | 2/2006 | Shibazaki et al. |
| 2007/0285526 A1* | 12/2007 | Mann ................. H04N 5/23245 348/222.1 |

(Continued)

FOREIGN PATENT DOCUMENTS

| CN | 101467444 | 6/2009 |
| CN | 102647565 | 8/2012 |

(Continued)

OTHER PUBLICATIONS

European Patent Office, Extended European Search Report for 16869384 dated Dec. 8, 2017.
(Continued)

*Primary Examiner* — Xi Wang
(74) *Attorney, Agent, or Firm* — Hodgson Russ LLP

(57) ABSTRACT

The present disclosure provides a method for generating an HDR image. The method includes: providing an image sensor, in which the image sensor includes a pixel array and a filter array disposed on the pixel array, and each filter unit in the filter array covers a plurality of pixel units in the pixel array so as to constitute a pixel structure unit; and performing an exposure control to pixel units within each pixel structure unit respectively, in which a first part of the pixel units within each pixel structure unit are exposed for a first exposure time, a second part of the pixel units within the pixel structure unit are exposed for a second exposure time, and the first exposure time is greater than the second exposure time.

14 Claims, 4 Drawing Sheets providing a pixel structure unit, in which the pixel structure unit includes a filter unit and a plurality of pixel units covered by the filter unit — S1 performing an exposure control to the pixel units, in which a first part of the pixel units are exposed for a first exposure time, a second part of the pixel units are exposed for a second exposure time, and the first exposure time is greater than the second exposure time — S2

(51) Int. Cl.
  *H04N 5/374* (2011.01)
  *H04N 5/378* (2011.01)
  *H04N 5/235* (2006.01)
  *H04N 5/355* (2011.01)
  *H01L 27/146* (2006.01)
  *H04N 9/04* (2006.01)

(52) U.S. Cl.
  CPC ......... *H04N 5/2353* (2013.01); *H04N 5/2355* (2013.01); *H04N 5/347* (2013.01); *H04N 5/35554* (2013.01); *H04N 5/35563* (2013.01); *H04N 5/374* (2013.01); *H04N 5/378* (2013.01); *H04N 9/045* (2013.01); *H04N 2209/045* (2013.01)

(58) Field of Classification Search
  USPC ...... 348/277, 280, 270, 268, 273; 250/208.1
  See application file for complete search history.

(56) References Cited

U.S. PATENT DOCUMENTS

| | | | |
|---|---|---|---|
| 2009/0101947 A1* | 4/2009 | Lin | H01L 27/14625 257/292 |
| 2009/0102939 A1* | 4/2009 | Ahuja | G03B 19/00 348/222.1 |
| 2010/0013969 A1 | 1/2010 | Ui | |
| 2011/0122301 A1* | 5/2011 | Yamura | H04N 5/2256 348/262 |
| 2013/0050520 A1 | 2/2013 | Takeuchi | |
| 2013/0271623 A1 | 10/2013 | Jo | |
| 2014/0063300 A1 | 3/2014 | Lin et al. | |
| 2014/0176724 A1* | 6/2014 | Zhang | H01L 27/14618 348/164 |
| 2014/0192250 A1 | 7/2014 | Mitsunaga | |
| 2014/0267828 A1 | 9/2014 | Kasai et al. | |
| 2015/0244916 A1 | 8/2015 | Kang et al. | |
| 2015/0350583 A1 | 12/2015 | Mauritzson et al. | |
| 2016/0248956 A1* | 8/2016 | Mitsunaga | H04N 5/3535 |

FOREIGN PATENT DOCUMENTS

| | | |
|---|---|---|
| CN | 103201766 | 7/2013 |
| CN | 103581563 | 2/2014 |
| CN | 103650480 | 3/2014 |
| CN | 105472266 | 4/2016 |
| JP | 2000069491 | 3/2000 |
| JP | 2013026722 A | 2/2013 |
| JP | 2013066140 A | 4/2013 |
| WO | 2014200939 | 12/2014 |
| WO | 2015050118 A1 | 4/2015 |
| WO | 2015083562 A1 | 6/2015 |

OTHER PUBLICATIONS

IPOS, Office Action for SG Application No. 11201704363Y, dated Feb. 9, 2018.
APO, Office Action for AU Application No. 2016358299, dated May 31, 2018.
APO, Office Action for AU Application No. 2016358299, dated Oct. 24, 2018.
IPOS, Office Action for SG Application No. 11201704363Y, dated Nov. 15, 2018.

* cited by examiner

METHOD FOR GENERATING HIGH-DYNAMIC RANGE IMAGE, CAMERA DEVICE, TERMINAL AND IMAGING METHOD

CROSS-REFERENCE TO RELATED APPLICATIONS

This application is a continuation application of an International Application No. PCT/CN2016/100883, filed on Sep. 29, 2016, which is based upon and claims priority to Chinese Patent Application No. 201510963939.2, filed on Dec. 18, 2015, the entire contents of which are incorporated herein by reference.

FIELD

The present disclosure relates to the camera device technology field, and more particularly, to a method for generating a high-dynamic range image, a camera device, a terminal and an imaging method.

BACKGROUND

With the development of smart phones, it is common increasingly to take photos by the mobile phone. In order to enhance photographing effect of the mobile phone, a variety of methods can be used from the front end to the back end so as to achieve the desired effect. However, for an HDR (High-Dynamic Range) image function when photographing, it needs to be further improved.

SUMMARY

The present disclosure aims to solve at least one of the problems in the related art to some extent.

In order to solve the above problems, an aspect of embodiments of the present disclosure provides a method for generating a high-dynamic range (HDR) image. An image sensor includes a pixel array and a filter array disposed on the pixel array. Each filter unit in the filter array covers a plurality of pixel units in the pixel array so as to constitute a pixel structure unit. The method includes: performing an exposure control to pixel units within each pixel structure unit respectively. A first part of the pixel units within each pixel structure unit are exposed for a first exposure time, and a second part of the pixel units within the pixel structure unit are exposed for a second exposure time. The first exposure time is greater than the second exposure time.

In order to solve the above problems, another aspect of embodiments of the present disclosure provides a camera device. The camera device includes: an image sensor and an image processor. The image sensor includes a pixel array and a filter array disposed on the pixel array. Each filter unit in the filter array covers a plurality of pixel units in the pixel array so as to constitute a pixel structure unit. The image processor is configured to perform an exposure control to pixel units within each pixel structure unit respectively. A first part of the pixel units within each pixel structure unit are exposed for a first exposure time, and a second part of the pixel units within the pixel structure unit are exposed for a second exposure time. The first exposure time is greater than the second exposure time.

A further aspect of embodiments of the present disclosure also provides a terminal. The terminal includes the camera device according to the above aspect of the embodiments.

The terminal can take photos. The obtained HDR images have higher sharpness, brighter colors, and better brightness, and can restore the scene more thoroughly and more realistically.

An embodiment of the present disclosure also provides an imaging method. An image sensor includes a pixel array and a filter array disposed on the pixel array. Each filter unit in the filter array covers a plurality of pixel units in the pixel array so as to constitute a pixel structure unit. The method includes: reading outputs of the pixel array; adding outputs of pixel units within a same pixel structure unit together to obtain a pixel value of the same pixel structure unit; and synthesizing pixel values of all the pixel structure units to obtain a single-frame HDR image.

In order to solve the above problems, yet another aspect of embodiments of the present disclosure provides a mobile terminal. The mobile terminal includes a housing; a processor; a memory; a circuit board; and a power supply circuit. The circuit board is located in a space formed by the housing. The processor and the memory are arranged on the circuit board. The power supply circuit is configured to supply power for each circuit or component in the mobile terminal. The memory is configured to store executable program codes. The processor is configured to execute a program corresponding to the executable program codes by reading the executable program codes stored in the memory so as to perform the imaging method according to the above embodiments of the present disclosure.

Yet another aspect of embodiments of the present disclosure provides a computer readable storage medium having instructions stored therein. When the processor of the mobile terminal executes the instructions, the mobile terminal performs the imaging method according to the above embodiments of the present disclosure.

Additional aspects and advantages of embodiments of the present disclosure will be given in part in the following descriptions, become apparent in part from the following descriptions, or be learned from the practice of the embodiments of the present disclosure.

DETAILED DESCRIPTION

Figure 1:
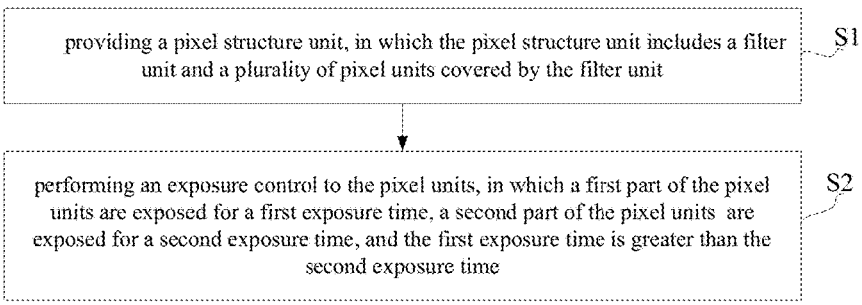
FIG. 1 is a flow chart showing a method for generating an HDR image in an image sensor according to an embodiment of the present disclosure.

Reference will be made in detail to embodiments of the present disclosure. Examples of the embodiments will be shown in drawings, in which the same or similar elements and the elements having same or similar functions are denoted by like reference numerals throughout the descriptions. The embodiments described herein according to drawings are explanatory and illustrative and used to generally understand the present disclosure. The embodiments shall not be construed to limit the present disclosure.

In general, for a single-frame HDR image, RGGB (Red-Green-Green-Blue) is used as a unit. The exposure time of interlaced exposure is inconsistent. The photographed row undergoing short exposure and the photographed row undergoing long exposure are combined into a single HDR image so as to generate the single-frame HDR image. However, the long exposure may cause serious noise, that is, during the usage of the long exposure, signals can be increased, and meanwhile noise also can be increased, such that sharpness of the whole single-frame HDR image would be significantly reduced. In addition, during the interlaced exposure, it is not clear whether the current row is in a bright scene or a dark scene, if the bright scene is combined with the long exposure, pixels in the current row may be over-exposed. If the over-exposure occurs, the pixels in this row will become unavailable, and this row needs to be complemented by interpolation of pixels in the next row or pixels in the last row, such that the sharpness may be significantly reduced.

In order to improve the image effect, there are a variety of methods. For example, for improving SNR (Signal Noise Ratio), the pixel merged method can be used in an image sensor with 16M pixels so as to achieve the improvement of the effect. A method for generating an HDR image and a camera device according to embodiments of the present disclosure are based on the image sensor with 16M pixels. 4M pixels are generated from the 16M pixels and are output, thereby improving the effect of the HDR image, and greatly improving the speed for the HDR image.

A method for generating an HDR image in an image sensor according to an embodiment of the present disclosure will be described below with reference to the drawings.

FIG. 1 is a flow chart showing a method for generating an HDR image in an image sensor according to an embodiment of the present disclosure. As illustrated in FIG. 1, the method includes the following.

S1, a pixel structure unit is provided.

The pixel structure unit includes a filter unit and a plurality of pixel units covered by the filter unit.

In some embodiments, the pixel structure unit can be provided in an image sensor. The image sensor can include a pixel array and a filter array disposed on the pixel array. The filter array can include a plurality of filter units with different colors. The pixel array includes a plurality of the pixel units, the filter units and corresponding pixel units constitute a plurality of the pixel structure units. Each filter unit can cover a plurality of pixel units (such as s*s pixel units, s≥2) in the pixel array so as to constitute a pixel structure unit. In some embodiments, the image sensor can include a complementary metal oxide semiconductor (COMS for short) image sensor.

In some embodiments, the filter array can include a Bayer array.

Figure 2:
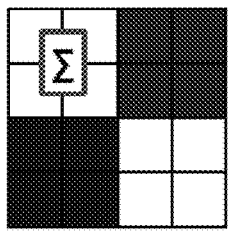
FIG. 2 is a schematic diagram illustrating combination of four pixel units in the pixel structure unit according to an embodiment of the present disclosure.

For example, as illustrated in FIG. 2, each filter unit covers 2*2 pixel units, i.e. four pixel units. In addition, the four pixel units, such as photodiodes, in the region indicated by the sum operator (Σ), correspond to a filter unit of the same color. The four pixel units are regarded as a pixel structure unit i.e., a monochromatic pixel.

It is understandable that, in addition to the structure of 2*2 pixel units, there are structures of 3*3, 4*4, and even any n*m (n and m are natural numbers) pixel units. The number of pixel units that can be arranged on the pixel array is limited. If each pixel structure unit contains too many pixel units, resolution of the image may be limited. For example, if a pixel value of the pixel array is 16M, the combined image with the resolution of 4M is obtained when each pixel structure unit having the structure of 2*2 pixel units is used, and the combined image with the resolution of 1M is obtained when each pixel structure unit having the structure of 4*4 pixel units is used. Therefore, each pixel structure unit with 2*2 pixel units is a better arrangement, which can improve brightness and sharpness of the image in the premise of sacrificing less resolution as possible.

S2, an exposure control is performed to the pixel units. A first part of the pixel units are exposed for a first exposure time, a second part of the pixel units are exposed for a second exposure time, and the first exposure time is greater than the second exposure time. In detail, the first exposure time can correspond to the long exposure and the second exposure time can correspond to the short exposure, that is, a two-stage exposure can be achieved in a single pixel, i.e., the pixel structure unit, and the pixel units undergoing the two-stage exposure are in the same color.

In an embodiment of the present disclosure, for each filter unit covering 2*2 pixel units, two pixel units in a row of each pixel structure unit respectively are controlled to be exposed for the first exposure time; and two pixel units in another row of the pixel structure unit respectively are controlled to be exposed for the second exposure time. For example, as illustrated in FIG. 2, four pixel units are combined into one pixel structure unit. The upper two pixel units are subjected to the long exposure. The lower two pixel units are subjected to the short exposure. Therefore, the control of the long exposure and the short exposure in the monochromatic pixel (i.e. the pixel structure unit) can be realized.

Figure 3:
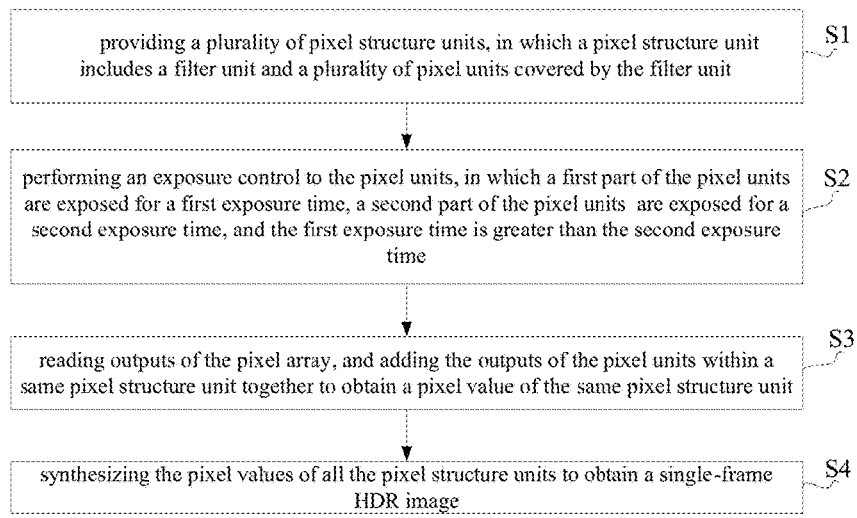
FIG. 3 is a flow chart showing a method for generating an HDR image in an image sensor according to an embodiment of the present disclosure.

Further, concerning the reading-out of pixel values, in an embodiment of the present disclosure, as illustrated in FIG. 3, the above method can further include the following.

S3, outputs of the pixel array are read, and outputs of pixel units within a same pixel structure unit are added together to obtain a pixel value of the same pixel structure unit.

In some embodiments, it may be assumed that the output of each pixel unit is S.

In detail, outputs of the pixel units in $k^{th}$ and $(k+1)^{th}$ rows are collected and stored into the register, where k=2n−1, n is a natural number, and k+1 is less than or equal to the number of rows of the pixel array; and the outputs of the pixel units in the $k^{th}$ and $(k+1)^{th}$ rows are extracted from the register, and the outputs of the pixel units within the same pixel structure unit are added together to obtain the pixel value of the same pixel structure unit.

That is, the imaging information of the pixel units undergoing the long exposure and the short exposure in each pixel structure unit is combined, i.e. the photographed row undergoing short exposure and the photographed row undergoing long exposure are combined into a single pixel so as to obtain the pixel value generated by the single pixel structure unit.

S4, the pixel values of all the pixel structure units are synthesized to obtain a single-frame HDR image.

The combined image in each pixel structure unit is merged into the single-frame HDR image, such that the 4M of HDR image is obtained.

It can be seen that, with the method for generating an HDR image according to an embodiment of the present disclosure, each filter unit can cover the plurality of pixel units, for example, based on the image sensor with 16M pixels, 4M pixels can be obtained by merging 16M pixels, that is, four pixel units are combined into one pixel structure unit, i.e. a single pixel; further, each pixel unit is subjected to a separate exposure, such that the control of the long and short exposure can be realized. Therefore, the obtained HDR image has a brighter color and a smaller noise, thereby avoiding emergence of unnecessary noise when some images are generated in RGGB way, and providing an implementation of a clear single-frame HDR, and providing to a user with a better photography experience.

Further, since the four pixel units with the same color are combined into one pixel structure unit i.e. the monochromatic pixel, the control of the long and short exposure can be realized in the single pixel. Therefore, the obtained HDR image does not have chaotic noise. Further, in the case where the current pixel unit undergoes the long exposure in a bright scene, since the long and short exposure is performed in the same large pixel, even if the interpolation compensation is performed, sharpness suffers less damage but remains consistent, such that sharpness of the HDR image is guaranteed.

Based on the method for generating an HDR image according to the embodiments of the above aspect, a camera device according to an embodiment of the present disclosure will be described below with reference to the drawings.

Figure 4:
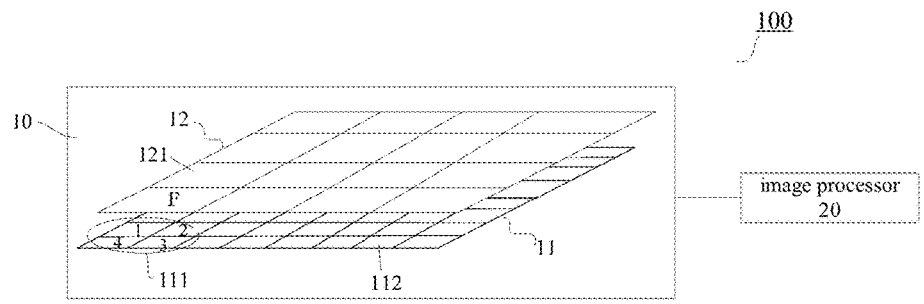
FIG. 4 is a block diagram showing a camera device according to an embodiment of the present disclosure.

FIG. 4 is a block diagram showing a camera device according to an embodiment of the present disclosure. As illustrated in FIG. 4, the camera device 100 can include a pixel structure unit 111 (in FIG. 4, the camera device 100 is illustrated to include a plurality of pixel structure units) and an image processor 20.

In an embodiment of the present disclosure, the pixel structure unit 111 includes a filter unit and a plurality of pixel units covered by the filter unit.

In some embodiments, the pixel structure unit 111 can be provided in an image sensor 10. The image sensor 10 can include a pixel array 11 and a filter array 12 disposed on the pixel array 11. The filter array 12 can include a plurality of filter units 121 with different colors. The pixel array 11 includes a plurality of the pixel units, the filter units and corresponding pixel units constitute a plurality of the pixel structure units. Each filter unit 121 can cover a plurality of pixel units 112 (such as s*s pixel units, s≥2) in the pixel array 11 so as to constitute a pixel structure unit 111. In detail, each filter unit covers 2*2 pixel units, for example, the pixel units 112 labeled as 1, 2, 3 and 4 in FIG. 3 constitute the pixel structure unit 111, and the pixel unit 1, the pixel unit 2, the pixel unit 3, and the pixel unit 4 correspond to the filter unit F such as a red filter unit. It can be considered that 2*2 pixel units with the same color are combined into one monochrome pixel. Therefore, 4M pixels may be formed from 16M pixels.

The image processor 20 is configured to perform an exposure control to the pixel units 112. In detail, the image processor 20 is configured to control a first part of the pixel units 112 to be exposed for a first exposure time, and control the second part of the pixel units 112 to be exposed for a second exposure time, in which the first exposure time is greater than the second exposure time. For example, the first exposure time can correspond to the long exposure and the second exposure time can correspond to the short exposure.

Further, the image processor 20 is further configured to read outputs of the pixel array 11, and to add the outputs of the pixel units 112 in the same pixel structure unit 111 together to obtain a pixel value of the same pixel structure unit 111, and to synthesize the pixel values of all the pixel structure units 111 to obtain a single-frame HDR image.

In detail, for each filter unit covering 2*2 pixel units, the image processor 20 is further configured to control two pixel units 112 in a row of each pixel structure unit 111 respectively to be exposed for the first exposure time, and to control two pixel units 112 in another row of the pixel structure unit 111 respectively to be exposed for the second exposure time. As illustrated in FIG. 2, the upper two pixel units are subjected to the long exposure and the lower two pixel units are subjected to the short exposure. That is, the same pixel structure unit 111, i.e. the monochromatic pixel, is subjected to the long and short exposure.

Further, since the four pixel units 112 with the same color are combined into one pixel structure unit 111 i.e. the monochromatic pixel, the control of the long and short exposure can be realized in the single pixel. Therefore, the obtained HDR image does not have chaotic noise. Further, in the case where the current pixel unit undergoes the long exposure in the bright scene, since the long and short exposure is performed in the same large pixel, even if the interpolation compensation is performed, the sharpness suffers less damage but remains consistent, such that sharpness of the HDR image is guaranteed.

It can be seen that, with the camera device 100 according to an embodiment of the present disclosure, each filter unit can cover the plurality of pixel units so as to form one pixel structure unit 111, i.e. a monochromatic pixel, and each pixel unit undergoes a separate exposure, such that the control of the long and short exposure can be realized in the monochrome pixel. Therefore, the obtained HDR image has a brighter color and a smaller noise, thereby improving the quality of the HDR image. In addition, sharpness of the HDR image can be ensured even when interpolation compensation is performed.

Figure 5:
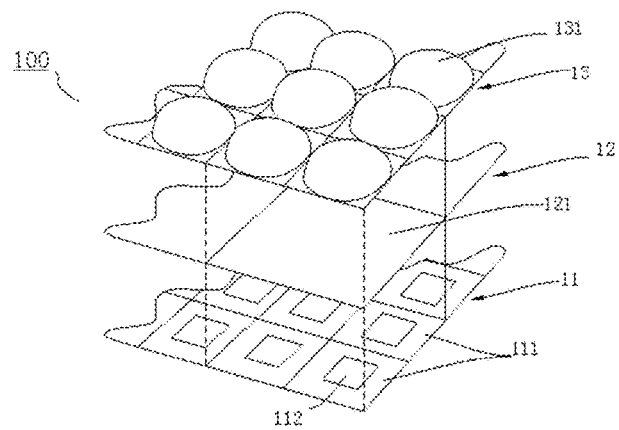
FIG. 5 is a block diagram showing a camera device according to another embodiment of the present disclosure.

As illustrated in FIG. 5, the image sensor 10 further includes a micro-mirror array 13 disposed on the filter array 12. Each micro-mirror 131 corresponds to one pixel unit 112. Each micro-mirror 131 corresponds to one pixel unit 112 with regard to shape, size, and position. The micro-mirror 131 can gather light into the photosensitive portion of the pixel unit 112 to enhance the photosensitivity of the pixel unit 112, thereby improving the quality of the image. In some embodiments, each filter unit 121 corresponds to 2*2 pixel units 112 and 2*2 micro-mirrors 131 so as to form the pixel structure unit 111.

Figure 6:
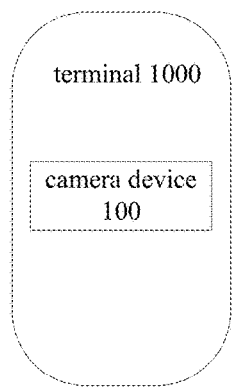
FIG. 6 is a block diagram showing a terminal according to an embodiment of the present disclosure.

FIG. 6 is a block diagram showing a terminal according to an embodiment of the present disclosure. The terminal 1000 can include the camera device 100 according to the above aspect of embodiments. In detail, the terminal 1000 may include a mobile phone.

Figure 7:
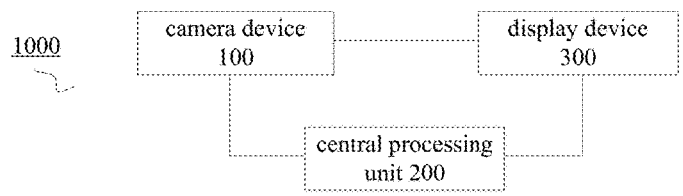
FIG. 7 is a block diagram showing a terminal according to another embodiment of the present disclosure.

As illustrated in FIG. 7, the terminal 1000 further includes a central processing unit 200 connected to the camera device 100 and a display device 300. The central processing unit 200 is configured to control the display device 300 to display the HDR image. In this way, the image captured by the terminal 1000 may be displayed on the display device 300 for the user's browsing. The display device 300 can include an LED display or the like.

The terminal 1000 according to the embodiments of the present disclosure can take photos and obtain the HDR image with higher sharpness and brighter color. The dark part of the image is darker and the bright part of the image is brighter, such that the light and shade contrast is more obvious, and the scene can be restored more thoroughly and realistically.

An embodiment of the present disclosure according to yet another aspect further provides an imaging method. The image sensor includes a pixel array and a filter array disposed on the pixel array, and each filter unit in the filter array covers a plurality of pixel units in the pixel array so as to constitute a pixel structure unit.

Figure 8:
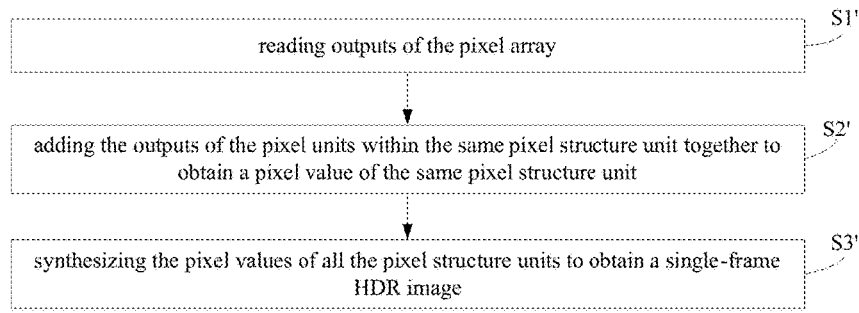
FIG. 8 is a flow chart showing an imaging method according to an embodiment of the present disclosure.

FIG. 8 is a flow chart showing an imaging method according to an embodiment of the present disclosure. As illustrated in FIG. 8, the method can include the following.

S1', outputs of the pixel array are read.

S2', the outputs of the pixel units within the same pixel structure unit are added together to obtain a pixel value of the same pixel structure unit.

S3', the pixel values of all the pixel structure units are synthesized to obtain a single-frame HDR image.

With the imaging method according to the embodiments of the present disclosure, it is assumed that the output of each pixel unit is S, the noise of each pixel unit is N, and the pixel structure unit includes m pixel units, so the pixel value of the pixel structure unit is n*m*S and the noise of the pixel structure unit is $$\frac{\sqrt{n*m*N^2}}{n*m}.$$

In the case of n=2, m=2, the noise of the pixel structure unit is about n*m*N/2. So the brightness of the pixel structure unit is improved under the low brightness environment, and the signal to noise ratio is increased.

Figure 9:
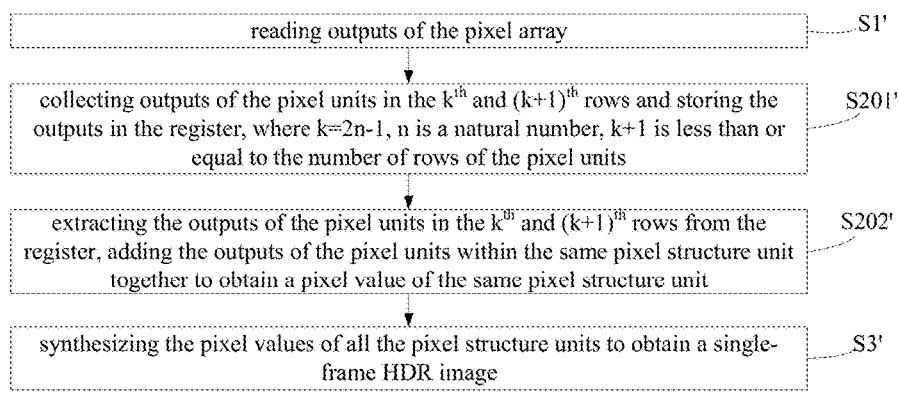
FIG. 9 is a flow chart showing an imaging method according to another embodiment of the present disclosure.

Referring to FIG. 9, in some embodiments, each filter unit of the same color in the image sensor corresponds to 2*2 pixel units and the image sensor includes a register. S2' further includes the following.

S201', outputs of the pixel units in the $k^{th}$ and $(k+1)^{th}$ rows are collected and stored into the register, where k=2n−1, n is a natural number, and k+1 is less than or equal to the number of rows of all the pixel units.

S202', the outputs of the pixel units in the $k^{th}$ and $(k+1)^{th}$ rows are extracted from the register, and the outputs of the pixel units within the same pixel structure unit are added together to obtain a pixel value of the same pixel structure unit.

In this way, the register can be used to achieve the processes of outputting, caching and combining the pixel units.

Figure 10:
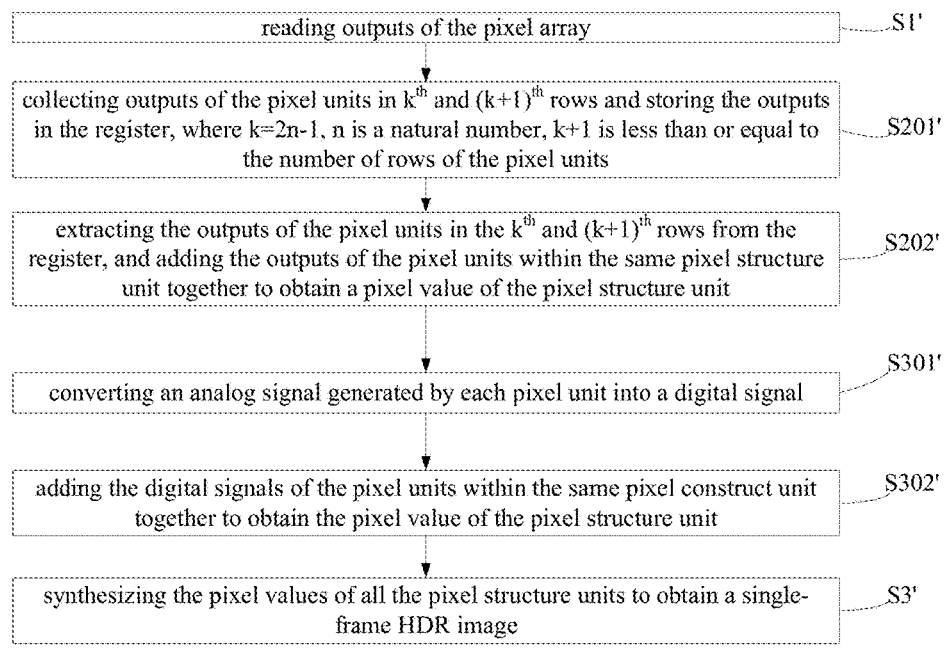
FIG. 10 is a flow chart showing an imaging method according to yet another embodiment of the present disclosure.

Referring to FIG. 10, in some embodiments, S2' further includes the following.

S301', an analog signal generated by each pixel unit is converted into a digital signal.

S302', the digital signals of the pixel units within the same pixel structure unit are added together so as to obtain the pixel value of the pixel structure unit.

In this way, on one hand, the image processing module, which is generally a digital signal processing chip, can directly process the output of the image sensor; on the other hand, compared with the technical solution in which the output in the analog signal format of the image sensor is directly processed through the circuit, the image information is retained. For example, for the image sensor with 16M pixels, the method according to the embodiments of the present disclosure, can be capable of generating the pixel structure unit of 4M pixels (with merging 2*2 pixels), or generating the original image with 16M pixels (i.e., without merging).

An embodiment of the present disclosure according to yet another aspect further provides a mobile terminal. The mobile terminal includes a housing; a processor; a memory; a circuit board; and a power supply circuit. The circuit board is located in a space formed by the housing. The processor and the memory are arranged on the circuit board. The power supply circuit is configured to supply power for each circuit or component in the mobile terminal. The memory is configured to store executable program codes. The processor is configured to execute a program corresponding to the executable program codes by reading the executable program codes stored in the memory so as to perform the imaging method according to the above aspect of embodiments.

An embodiment of the present disclosure further provides a computer readable storage medium having instructions stored therein. When the processor of the mobile terminal executes the instructions, the mobile terminal performs the imaging method illustrated in FIG. 8.

It is to be noted that, in the context, relational terms such as first and second are used only to distinguish an entity or an operation from another entity or another operation without necessarily requiring or implying that such entities or operations have any such actual relationship or sequence. Moreover, terms "include", "comprise" or any other variant thereof is intended to encompass a non-exclusive inclusion such that processes, methods, articles, or devices that include a series of elements include not only those elements but also those that are not explicitly listed. In the absence of more restrictions, the elements defined by the statement "including a . . . " do not preclude the presence of additional elements in the process, method, article, or device that includes the elements.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the above phrases in various places throughout this specification are not necessarily referring to the same embodiment or example of the present disclosure. Furthermore, the particular features, structures, materials, or characteristics may be combined in any suitable manner in one or more embodiments or examples. In addition, under the situation of not conflicting mutually, those skilled in the related art may combine different embodiments or examples with features of different embodiments or examples described through this specification.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for generating a high-dynamic range (HDR) image, comprising:
   providing a pixel structure unit, the pixel structure unit comprising a filter unit having a same color and a plurality of pixel units covered by the filter unit, the pixel structure unit being provided in an image sensor, the image sensor comprising a pixel array and a filter array disposed on the pixel array, the filter array comprising a plurality of the filter units, the pixel array comprising a plurality of the pixel units, the filter units and corresponding pixel units constitute a plurality of the pixel structure units, wherein each filter unit covers 2*2 pixel units; and
   controlling two pixel units in a row of the pixel structure unit respectively to be exposed for the first exposure time, and controlling two pixel units in another row of the pixel structure unit respectively to be exposed for the second exposure time, wherein the first exposure time is greater than the second exposure time.

2. The method according to claim 1, further comprising:
   reading outputs of the pixel array, and adding outputs of pixel units within a same pixel structure unit together to obtain a pixel value of the same pixel structure unit; and
   synthesizing pixel values of all the pixel structure units to obtain a single-frame HDR image.

3. A camera device comprising:
   a pixel structure unit, wherein the pixel structure unit comprises a filter unit having a same color and a plurality of pixel units covered by the filter unit, the pixel structure unit being provided in the image sensor, the image sensor comprising a pixel array and a filter array disposed on the pixel array, the filter array comprising a plurality of the filter units, the pixel array comprising a plurality of the pixel units, the filter units and corresponding pixel units constitute a plurality of the pixel structure units, wherein each filter unit covers 2*2 pixel units;
   an image processor, configured to control two pixel units in a row of the pixel structure unit respectively to be exposed for the first exposure time, and to control two pixel units in another row of the pixel structure unit respectively to be exposed for the second exposure time, wherein the first exposure time is greater than the second exposure time.

4. The camera device according to claim 3, wherein the image sensor comprises a complementary metal oxide semiconductor (CMOS) image sensor.

5. The camera device according to claim 3, wherein the filter array comprises a Bayer array.

6. The camera device according to claim 3, wherein the image processor is further configured to read outputs of the pixel array, and to add outputs of pixel units within a same pixel structure unit together to obtain a pixel value of the same pixel structure unit, and to synthesize pixel values of all the pixel structure units to obtain a single-frame HDR image.

7. The camera device according to claim 3, wherein the image sensor further comprises:
   a micro-mirror array disposed on the filter array, each micro-mirror corresponding to one pixel unit.

8. An imaging method, wherein an image sensor comprises a pixel array and a filter array disposed on the pixel array, and each filter unit having a same color in the filter array covers a plurality of pixel units in the pixel array so as to constitute a pixel structure unit and an image processor is configured to control two pixel units in a row of the pixel structure unit respectively to be exposed for the first exposure time, and to control two pixel units in another row of the pixel structure unit respectively to be exposed for the second exposure time, wherein the first exposure time is greater than the second exposure time, and the method comprises:
   reading outputs of the pixel array;
   adding outputs of pixel units within a same pixel structure unit together to obtain a pixel value of the same pixel structure unit; and
   synthesizing pixel values of all the pixel structure units to obtain a single-frame HDR image.

9. The method according to claim 8, wherein each filter unit covers 2*2 pixel units.

10. The method according to claim 8, wherein the image sensor comprises a register, and the act of reading further comprises:
    collecting outputs of pixel units in $k^{th}$ and $(k+1)^{th}$ rows and storing the outputs of the pixel units in the $k^{th}$ and $(k+1)^{th}$ rows into the register, where k=2n−1, n is a natural number, k+1 is less than or equal to a number of rows of the pixel units; and extracting the outputs of the pixel units in the $k^{th}$ and $(k+1)^{th}$ rows from the register, and adding the outputs of the pixel units within the same pixel structure unit together to obtain the pixel value of the same pixel structure unit.

11. The method according to claim 9, wherein the image sensor comprises a register, and the act of reading further comprises:

collecting outputs of pixel units in $k^{th}$ and $(k+1)^{th}$ rows and storing the outputs of the pixel units in the $k^{th}$ and $(k+1)^{th}$ rows into the register, where k=2n−1, n is a natural number, k+1 is less than or equal to a number of rows of the pixel units; and extracting the outputs of the pixel units in the $k^{th}$ and $(k+1)^{th}$ rows from the register, and adding the outputs of the pixel units within the same pixel structure unit together to obtain the pixel value of the same pixel structure unit.

12. The method according to claim 8, wherein the act of reading further comprises:

converting an analog signal generated by each pixel unit into a digital signal for outputting.

13. The method according to claim 9, wherein the act of reading further comprises:

converting an analog signal generated by each pixel unit into a digital signal for outputting.

14. The method according to claim 10, wherein the act of reading further comprises:

converting an analog signal generated by each pixel unit into a digital signal for outputting.

\* \* \* \* \*